(12) United States Patent
Gipson et al.

(10) Patent No.: US 10,656,323 B1
(45) Date of Patent: May 19, 2020

(54) PREFORMED LIGHT GUIDE WITH POCKETS FOR LIGHT EMITTING DIODES MOUNTED TO A PRINTED CIRCUIT BOARD

(71) Applicant: Dura Operating, LLC, Auburn Hills, MI (US)

(72) Inventors: Ron Gipson, Metamora, MI (US); Bhanumurthy Veeragandham, Auburn Hills, MI (US)

(73) Assignee: DURA OPERATING, LLC, Aurburn Hills, MI (US)

(*) Notice: Subject to any disclaimer, the term of this patent is extended or adjusted under 35 U.S.C. 154(b) by 0 days.

(21) Appl. No.: 16/109,167

(22) Filed: Aug. 22, 2018

(51) Int. Cl.
| | |
|---|---|
| *F21V 8/00* | (2006.01) |
| *H05K 1/02* | (2006.01) |
| *G02B 6/42* | (2006.01) |
| *H04M 1/22* | (2006.01) |

(52) U.S. Cl.
CPC ......... *G02B 6/0073* (2013.01); *G02B 6/0065* (2013.01); *G02B 6/0068* (2013.01); *G02B 6/0091* (2013.01); *G02B 6/42* (2013.01); *H05K 1/0274* (2013.01); *G02B 6/006* (2013.01); *H04M 1/22* (2013.01)

(58) Field of Classification Search
CPC .. G02B 6/0073; G02B 6/0065; G02B 6/0068; G02B 6/006; G02B 6/0091; G02B 6/0095; G02B 6/42; G02B 6/4212; G02B 6/4253–4265; H05K 2203/13–1327; H05K 5/0034; H05K 5/003; H05K 5/0047; H05K 5/06–069; H04M 1/22; G09G 3/34–348
See application file for complete search history.

(56) References Cited

U.S. PATENT DOCUMENTS

| | | | |
|---|---|---|---|
| 4,229,783 A | 10/1980 | Eberhardt | |
| 5,235,636 A * | 8/1993 | Takagi | H01H 13/7006 379/368 |
| 5,708,428 A * | 1/1998 | Phillips | H01H 13/702 200/314 |
| 6,006,118 A * | 12/1999 | Stephenson | H01H 13/702 362/23.03 |
| 7,249,861 B2 * | 7/2007 | Coleman | G06F 1/1662 200/314 |
| 9,869,810 B2 | 1/2018 | Keranen et al. | |
| 10,219,368 B1 * | 2/2019 | Gipson | H05K 1/0274 |

(Continued)

*Primary Examiner* — Mariceli Santiago
(74) *Attorney, Agent, or Firm* — Vivacqua Crane, PLLC

(57) ABSTRACT

A molded component assembly includes a printed circuit board with a first face and an oppositely facing second face. Multiple light emitting diodes are mounted on a first portion of the first face. Multiple electronics components are mounted on a second portion of the first face. A light guide of a light translucent polymeric material has a contact surface, multiple light outlets, and multiple light emitting diode receiving pockets defining recesses in the contact surface, each sized to receive one of the light emitting diodes when the contact surface directly contacts the first portion of the first face, with visible light from the light emitting diodes transmitted through the light guide to the light outlets. A first polymeric material is molded over a portion of the second portion of the first face encapsulating the electronics components and contacting a portion of the light guide.

20 Claims, 7 Drawing Sheets

(56) References Cited

U.S. PATENT DOCUMENTS

| | | | |
|---|---|---|---|
| 2004/0176048 A1* | 9/2004 | Klinghult | H01H 13/70 455/90.3 |
| 2005/0265029 A1 | 12/2005 | Epstein et al. | |
| 2010/0203929 A1* | 8/2010 | Skagmo | B29C 45/14065 455/575.1 |
| 2017/0371092 A1 | 12/2017 | Keranen et al. | |

* cited by examiner

PREFORMED LIGHT GUIDE WITH POCKETS FOR LIGHT EMITTING DIODES MOUNTED TO A PRINTED CIRCUIT BOARD

FIELD

The present disclosure relates generally to printed circuit boards having at least one light generating component and a light guide.

BACKGROUND

The statements in this section merely provide background information related to the present disclosure and may or may not constitute prior art.

Electronic assemblies with backlit visual elements may be manufactured via several processes. Most commonly, a plastic part of a polymeric material resin is molded with some portion of the plastic being clear or translucent, with electronics components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronics components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("package") onto a polymer film, form the film into a desired shape, and then insert the formed film into an injection mold having substantially the same shape. A following step injection-molds plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Electronics components may also be printed onto a film. The film is then inserted into an injection mold, where plastic is molded onto the film, the electronics components being embedded in the molded plastic so that when the plastic part is removed from the mold the film is peeled away from the plastic part, leaving the electronics components embedded in or adhered to the surface of the plastic part.

Thus, while current printed film assemblies achieve their intended purpose, there is a need for a new and improved system and method for preparing light guides used for film assemblies having light emitting diodes.

SUMMARY

According to several aspects, a molded component assembly includes a printed circuit board with a first face and an oppositely facing second face. Multiple light emitting diodes are mounted on a first portion of the first face. Multiple electronics components are mounted on a second portion of the first face. A light guide of a light translucent polymeric material has a contact surface, multiple light outlets, and multiple light emitting diode receiving pockets defining recesses in the contact surface, each sized to receive one of the light emitting diodes when the contact surface directly contacts the first portion of the first face, with visible light from the light emitting diodes transmitted through the light guide to the light outlets. A first polymeric material is molded over a portion of the second portion of the first face encapsulating the electronics components and contacting a portion of the light guide.

In another aspect of the present disclosure, the printed circuit board includes multiple through apertures extending from the first face to the second face; and the light guide includes multiple light lenses each extending into one of the through apertures to create a light outlet from each of the light lenses.

In another aspect of the present disclosure, a distal end of each of the light lenses defines a substantially flat face having a geometry that substantially matches a geometry of the through apertures, with the distal end positioned substantially flush with the second face of the printed circuit board.

In another aspect of the present disclosure, a distal end of each of the light lenses defines a substantially flat face having a geometry that substantially matches a geometry of the through apertures, with the distal end spaced apart from the second face of the printed circuit board.

In another aspect of the present disclosure, an opaque layer is positioned over the second face of the printed circuit board having translucent openings positioned opened over each of the light outlets.

In another aspect of the present disclosure, the pockets each have a shape corresponding to a shape of the light emitting diodes.

In another aspect of the present disclosure, each of the pockets includes an incident surface, the incident surface having a texture to control transmission of the visible light to the light guide.

In another aspect of the present disclosure, the multiple light lenses each include multiple beveled surfaces that are non-orthogonal with the contact surface to reflect the visible light to the light outlets.

In another aspect of the present disclosure, a second polymeric material is over-molded over the light guide and over the first material.

In another aspect of the present disclosure, the light emitting diodes define side firing diodes, with visible light emitted from the light emitting diodes directed generally parallel to the first face of the printed circuit board.

In another aspect of the present disclosure, the light guide includes a side surface extending from the contact surface, having the first polymeric material contacting a portion of the side surface.

In another aspect of the present disclosure, the side surface is perpendicular to the contact surface.

According to several aspects, a molded component assembly includes a printed circuit board with a first face and an oppositely facing second face, having multiple through apertures extending from the first face to the second face. Multiple light emitting diodes are mounted on a first portion of the first face. Multiple electronics components are mounted on a second portion of the first face. A light guide of a light translucent polymeric material has a contact surface; and multiple light emitting diode receiving pockets defining recesses in the contact surface, each sized to receive one of the light emitting diodes when the contact surface directly contacts the first portion of the first face, with visible light from the light emitting diodes transmitted through the light guide. A first polymeric material is molded over a portion of the second portion of the first face encapsulating the electronics components and contacting a portion of the light guide. Each of pockets is spaced at a predefined distance from one of the through apertures to maximize light generated by the light emitting diodes entering the light guide.

In another aspect of the present disclosure, the light guide includes multiple light lenses each extending over one of the through apertures to create a light outlet from each of the light lenses.

In another aspect of the present disclosure, a width of each of the light emitting diodes is less than a width of a planar reflector surface of each of the light lenses so that substantially all of the light emitted from each of the light emitting diodes enters one of the light lenses.

In another aspect of the present disclosure, each of the multiple light lenses is homogeneously connected to the light guide and each extends at least partially into one of the through apertures.

In another aspect of the present disclosure, each of the pockets includes an open end opening at the contact surface, and a closed end wall embedded within a body of the light guide.

According to several aspects, a molded component assembly includes a printed circuit board with a first face and an oppositely facing second face, having multiple through apertures extending from the first face to the second face. Multiple side firing light emitting diodes are mounted on a first portion of the first face each directing visible light substantially parallel to the first face. Multiple electronics components are mounted on a second portion of the first face. A light guide of a light translucent polymeric material hays a contact surface; multiple light lenses each extending at least partially into one of the through apertures to create a light outlet from each of the light lenses; and multiple light emitting diode receiving pockets defining recesses in the contact surface, each sized to receive one of the light emitting diodes when the contact surface directly contacts the first portion of the first face, with visible light from the light emitting diodes transmitted through the light guide. A first polymeric material is molded over a portion of the second portion of the first face encapsulating the electronics components and contacting a portion of the light guide, and a second polymeric material is overmolded onto the first polymeric material and at least a portion of the light guide. Each of pockets is spaced at a predefined distance from one of the through apertures to maximize light generated by the light emitting diodes entering the light guide and each has a shape corresponding to a shape of the light emitting diodes.

In another aspect of the present disclosure, the multiple light lenses each include multiple beveled surfaces to reflect the visible light to the light outlets.

In another aspect of the present disclosure, a substantially opaque layer of a polymeric material positioned over the second face of the printed circuit board having translucent openings positioned over each of the through apertures, the translucent openings defining successive number pairs.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
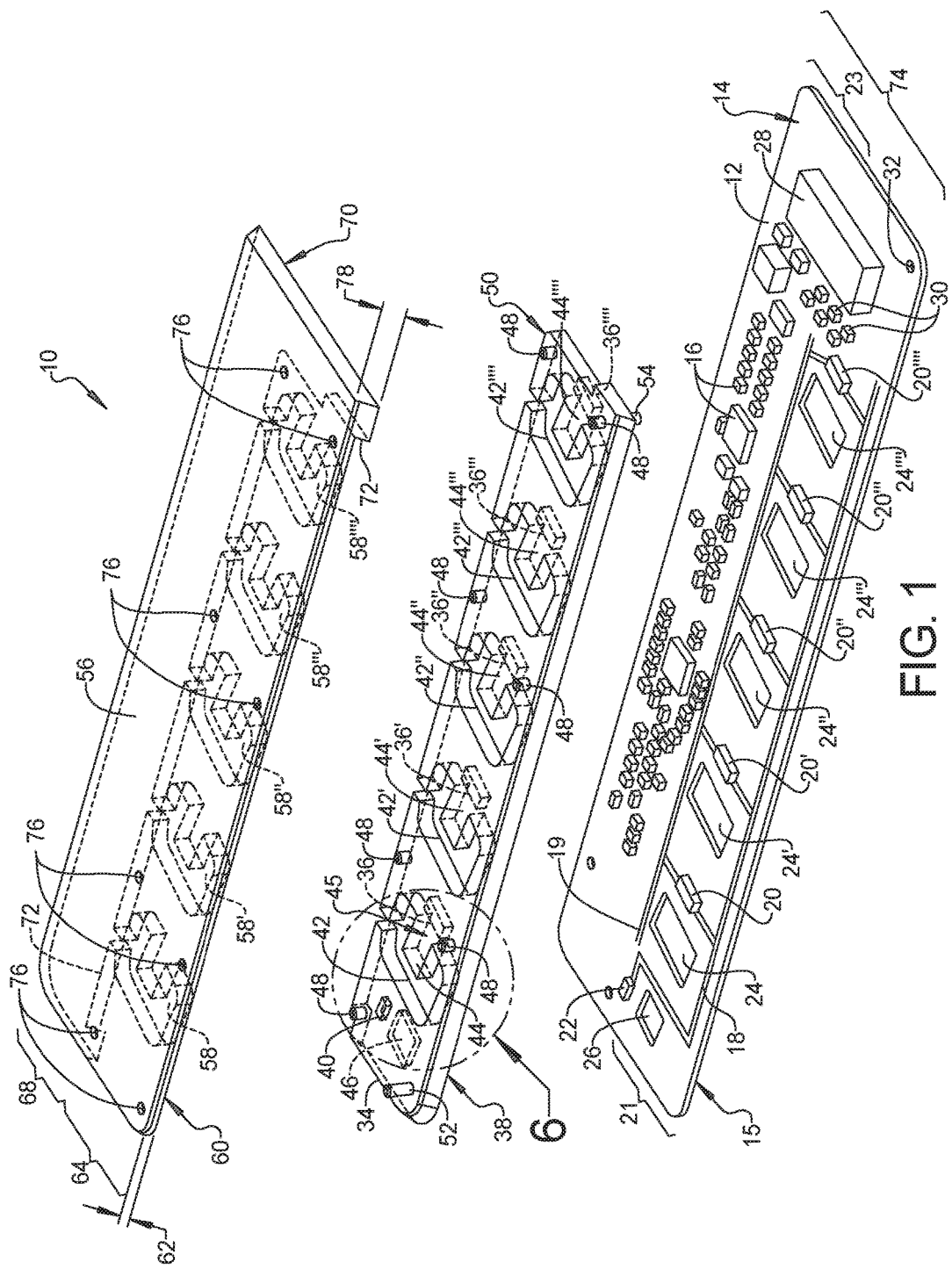
FIG. 1 is a front perspective assembly view of a molded component assembly according to an exemplary embodiment.

Referring to FIG. 1, a laminated light guide and component carrier defining a molded component assembly 10 includes a molded polymeric material or a metal body 12 such as a printed circuit board having multiple electrical components mounted thereon. According to several aspects, the body 12 defines a rectangular shape, however any desired geometric shape may be used. The body 12 includes a first side or first face 14 and an oppositely directed second face 15. On the first face 14 of the body 12 are located multiple electronics components 16 including capacitors, which are electrically connected to a plurality of first electrical traces 18, 19 (only partially shown for clarity) printed for example by a screen printing process onto the first face 14.

Multiple light emitting diodes 20, 20', 20'', 20''', 20'''' are also individually mounted on a first portion 21 of the first face 14 and are connected to the electrical traces 18, 19. An additional light emitting diode 22 can optionally be provided at one end of the first portion 21 of the first face 14 of the body 12 to provide an illuminated indication that electrical power is available for the molded component assembly 10. According to several aspects, the multiple electronics components 16 are disposed on a second portion 23 of the first face 14 of the body 12. According to several aspects, the light emitting diodes 20, 20', 20'', 20''', 20'''' define side firing diodes, with visible light emitted from the light emitting diodes directed generally parallel to the first face 14.

Positioned proximate to each of the light emitting diodes 20, 20' are multiple individual through apertures 24, 24', 24'', 24''', 24'''' created in the body 12. According to several aspects each of the through apertures 24, 24', 24'', 24''', 24'''' are square or rectangular shaped, however any geometry can be selected. A separate through aperture 26 may also be provided proximate to the light emitting diode 22, which is similar to the through apertures 24, 24', 24'', 24''', 24'''' in function, but may have a smaller cross section. Also positioned on the first face 14 of the body 12 is a connector 28 which is connected to the electrical traces 18, 19. Multiple capacitive touch film contacts 30 are provided proximate to a space envelope of the connector 28. Multiple through apertures 32 are provided through the body 12 which frictionally receive pins discussed below.

A light guide 34 is molded from a single injection molding shot of an optically clear polymeric material such as polymethyl methacrylate (PMMA) which is transparent or translucent to allow light passage through the light guide 34. Multiple light emitting diode receiving pockets 36, 36', 36", 36'", 36"" are formed that open from a contact surface 38 defining a molded body facing side of the light guide 34. Each of the pockets 36, 36', 36", 36'", 36"" is sized to receive and partially surround one of the light emitting diodes 20, 20', 20", 20'", 20"" when the contact surface 38 of the light guide 34 directly contacts the first face 14 of the body 12. A separate pocket 40 is also created in the light guide 34 which receives the light emitting diode 22.

Multiple generally U-shaped cavities defining light outlets 42, 42', 42", 42'", 42"" are created through the light guide 34 each aligned with individual ones of the through apertures 24, 24', 24", 24'", 24"" when the light guide 34 is placed in direct contact with the first face 14 of the body 12. Multiple light reflectors or light lenses 44, 44', 44", 44'", 44"", co-molded of the PMMA material and homogeneously connected to the light guide 34 each extend into one of the light outlets 42. Each of the light lenses 44, 44', 44", 44'", 44"" includes a planar reflector surface 45 oriented substantially parallel to the contact surface 38. When the light guide 34 is positioned on the body 12 each of the light lenses 44, 44', 44", 44'", 44"" substantially overlaps one of the through apertures 24, 24', 24", 24'", 24"" with the light guide 34 press-fit onto pins described below extending from the first face 14 of the body 12. A separate light lens 46 also co-molded of the PMMA material and homogeneously connected to the light guide 34 overlaps the through aperture 26 when the light guide 34 is positioned on the body 12.

Multiple male projections defining first pins 48 co-molded of the PMMA material and homogeneously connected to the light guide 34 extend upwardly as viewed in FIG. 1 away from an outer surface 50 of the light guide 34. A separate male projection defining an alignment pin 52 which is longer than the first pins 48 can also be provided. In addition to the first pins 48 extending from the outer surface 50, multiple male projections defining second pins 54, only one of which is partially visible in this view, extend downwardly away from the contact surface 38. Each of the second pins 54 is frictionally received in one of the through apertures 32 formed in the body 12 when the light guide 34 is press-fit onto the first face 14 of the body 12.

A reflector plate 56 of a polymeric material such as an injected resin or a stamped film is molded using a molding process. The reflector plate 56 is positioned in direct contact with the outer surface 50 of the light guide 34 and covers the electronics components 16, and directly contacts a portion of the first face 14 of the body 12. According to several aspects, the reflector plate 56 is white in color to reflect visible light created when the light emitting diodes 20, 20', 20", 20'", 20"", 22 are energized which would otherwise escape through the light guide 34 and return the light back into the light guide 34. When the light guide 34 is positioned on the body 12 a portion of the reflector plate 56 also directly contacts the planar reflector surface 45 of each of the light lenses 44, 44', 44", 44'", 44"". Multiple filler members 58 are co-molded with and homogeneously extend from a lower surface 60 of the reflector plate 56. Each of the filler members 58 is sized to be slidably received in and to substantially fill one of the cavities defining the light outlets 42 extending through the light guide 34 when the lower surface 60 is brought into direct contact with the outer surface 50 of the light guide 34. The light outlets 42 created in the light guide 34 receive the filler members 58 which extend from the reflector plate 56 to add white reflective material of the reflector plate 56 directly into the light guide 34.

A first thickness 62 of the reflector plate 56 in in a first section 64 of the filler members 58 is less than a second thickness 66 defining a second section 68 of the reflector plate 56. A planar surface 70 is created in the second section 68 having the second thickness 66, and a partial cavity 72 is provided in the first section 64 having the filler members 58. The planar surface 70 directly contacts an area 74 of the first face 14 of the body 12 when the reflector plate 56 is brought into direct contact with each of the light guide 34 and the body 12, with the light guide 34 positioned within the partial cavity 72. Each of the first pins 48 of the light guide 34 are frictionally received in one of multiple through apertures 76 created in the reflector plate 56 to fix the reflector plate 56 onto the light guide 34. A full thickness body portion 78 of the reflector plate 56 is created outside of the partial cavity 72, which provides the planar surface 70.

Figure 7:
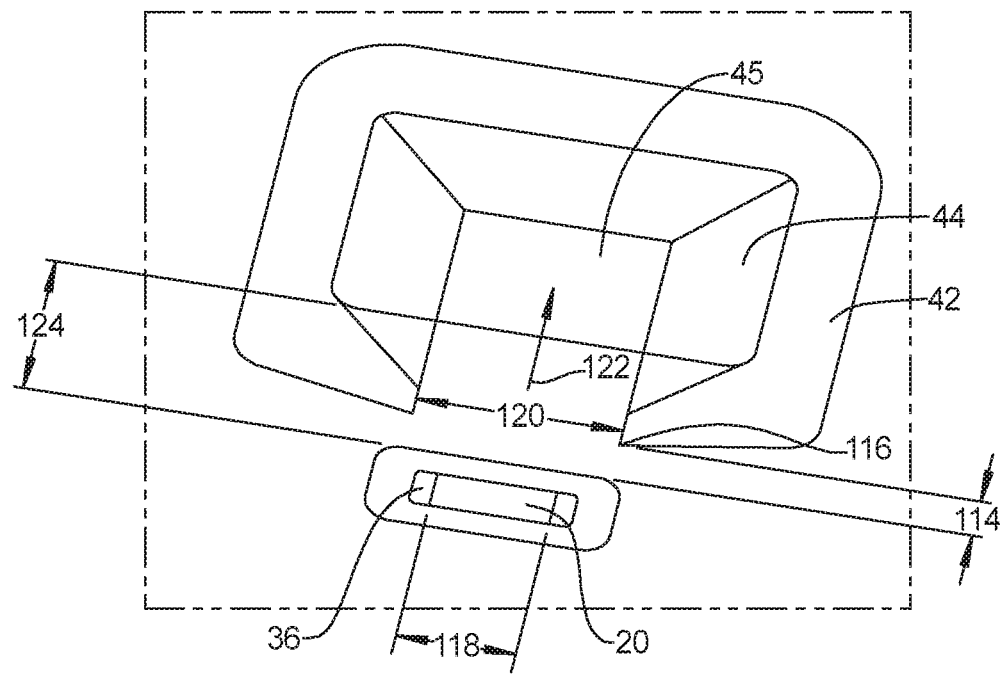
FIG. 7 is a top plan view of area 7 of FIG. 2.
Figure 8:
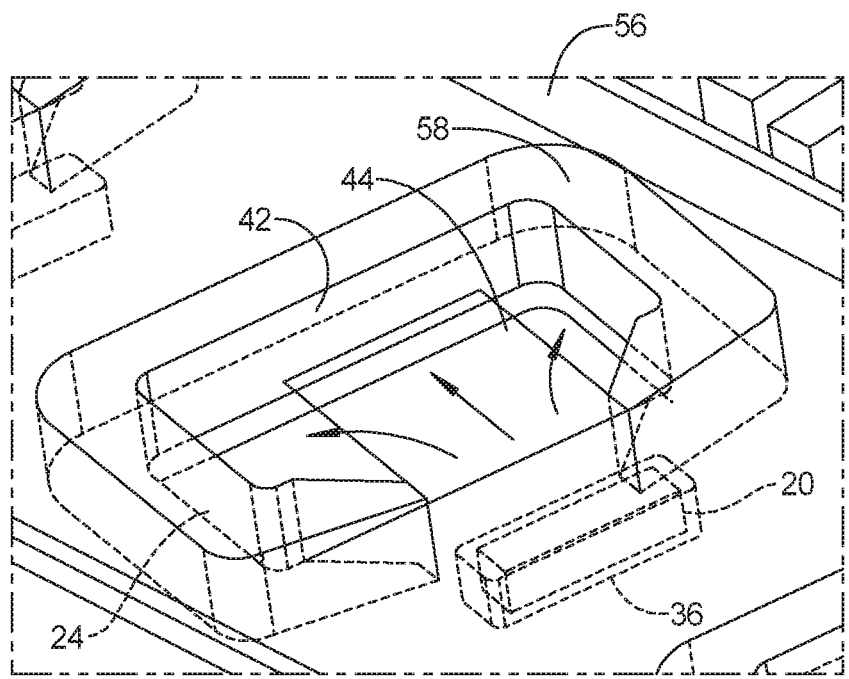
FIG. 8 is a top perspective view of a single light emitting diode receiving pocket and light emitting diode of the assembled molded component assembly of FIG. 2.

Referring to FIG. 2 and again to FIG. 1, a completed assembly of the molded component assembly 10 provides the light guide 34 frictionally coupled to the body 12 using the second pins 54, and the reflector plate 56 overlayed onto and frictionally coupled to both the light guide 34 and the body 12 using the first pins 48 and the alignment pin 52. In the assembled condition, each of the light emitting diodes such as the light emitting diode 20 is received in one of the pockets such as the pocket 36 as will be described in greater detail in reference to FIGS. 6 through 8. Light generated by each light emitting diode as visible light is directed primarily toward the light lens of its associated light guide, such as from the light emitting diode 20 toward the light lens 44, in the direction of a light arrow 80. Each light guide disperses light out via one of the through apertures 24, 24', 24", 24'", 24"", for example light from the light emitting diode 20 is dispersed through the light lens 44 out via the through aperture 24. The openings provided in the light guide 34 via the light outlets 42 surrounding the light guides help limit light dispersion through only one of the through apertures via only one of the light guides, such as through the through aperture 24 via the light lens 44.

Figure 9:
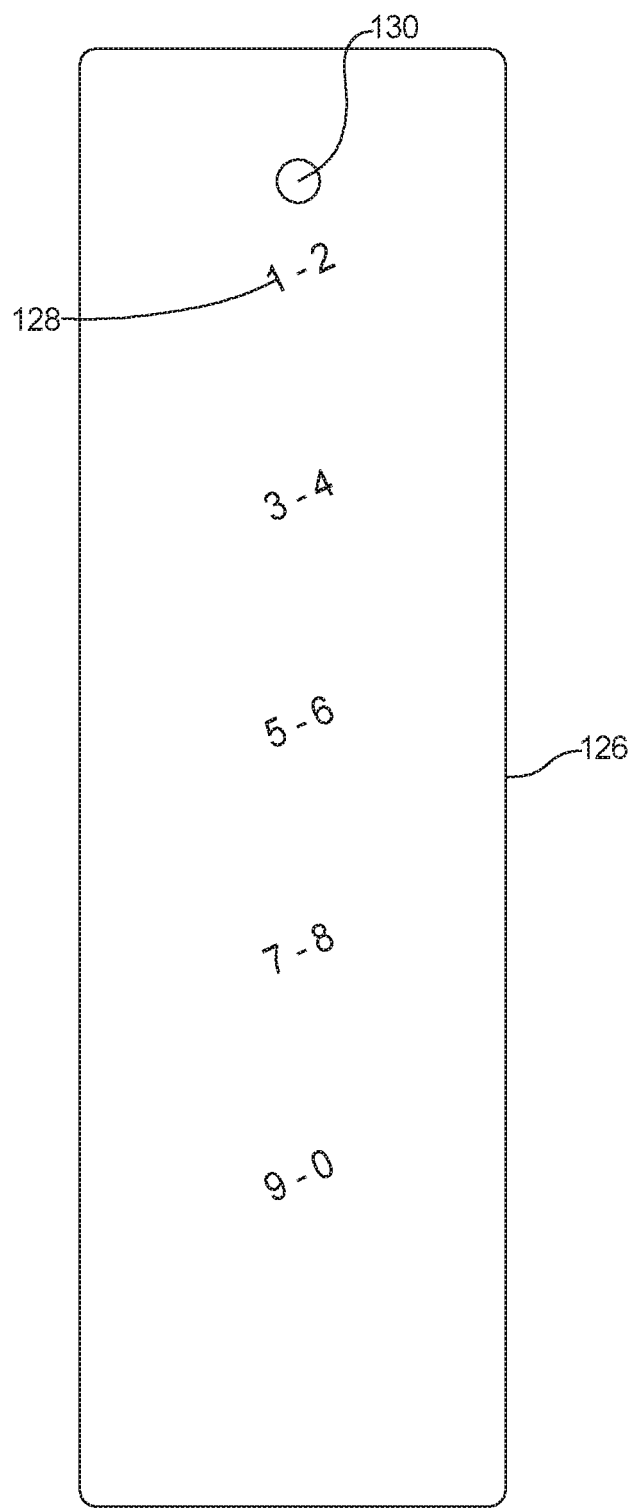
FIG. 9 is a bottom plan view of the assembled molded component of FIG. 1.

Light rays as visible light emitted from the light emitting diodes 20, 20', 20", 20'", 20"" reflect off multiple beveled surfaces 82, 84, 86 of each of the light lenses 44, which direct the light rays out the through apertures 24, 24', 24", 24'", 24"". Light rays emitted by the light emitting diode 22 are directed out the through aperture 26. The light rays as visible light pass through graphics created on a finish layer of an acrylonitrile butadiene styrene (ABS) plastic (shown and described in reference to FIG. 9) of the molded component assembly 10. The angles of the beveled surfaces 82, 84, 86 are each oriented approximately 45 degrees with respect to the contact surface 38 which is oriented parallel to the outer surface 50 of the light guide 34. The beveled surfaces 82, 84, 86 reflect and direct the light to intensify the light toward a center of each of the light lenses 44. Visible light emitted by the light emitting diodes 20, 20', 20", 20'", 20"", 22 also reflects off the white reflector plate 56 back toward the light guide 34 and the body 12, and is thereby available to be reflected off the multiple beveled surfaces 82, 84, 86 and out the through apertures 24, 24',24", 24'", 24"".

Figure 2:
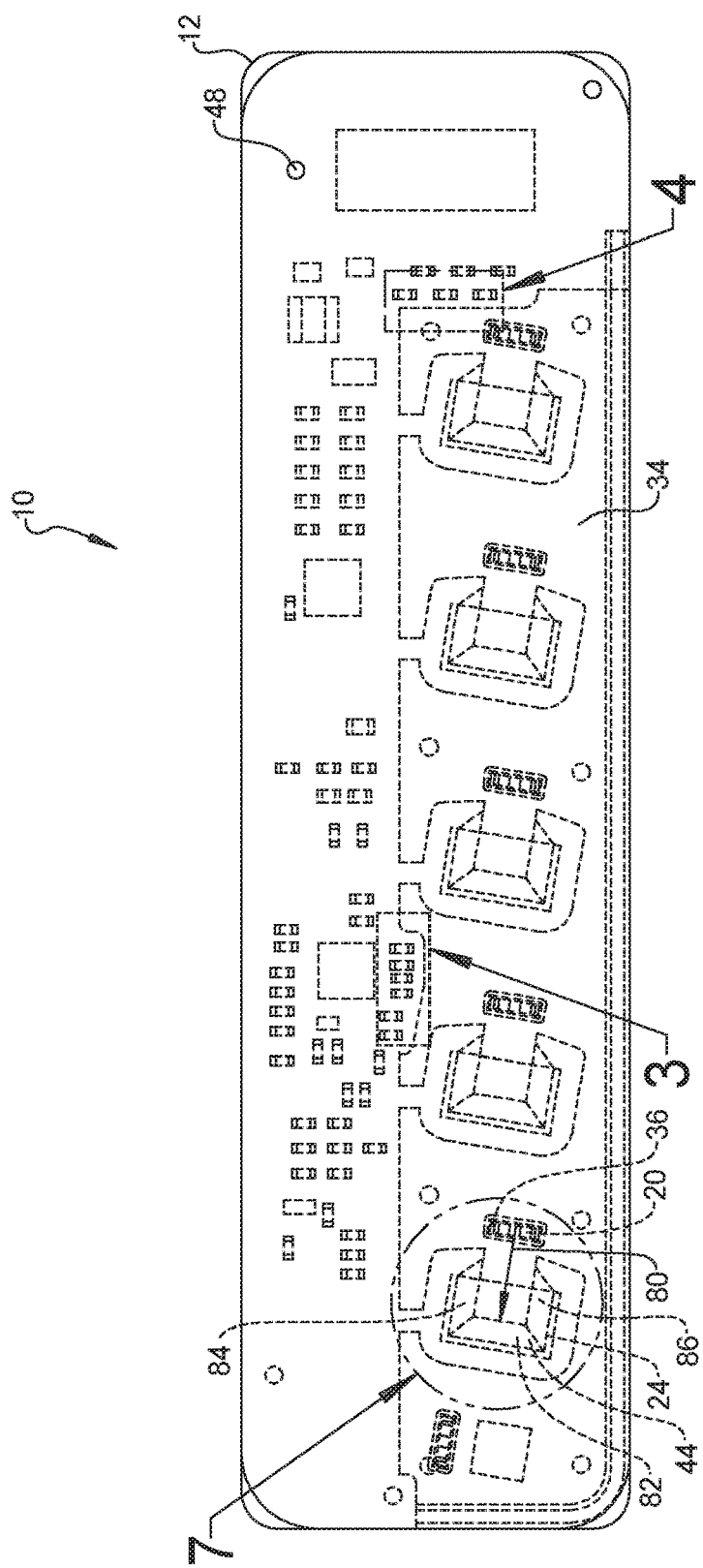
FIG. 2 is a top plan view of an assembled molded component assembly of FIG. 1.

Referring to FIG. 3 and again to FIGS. 1 through 2, the second portion 23 of the body 12 having the electronics components 16 mounted thereon is generally not covered or contacted by the light guide 34. To encapsulate and environmentally protect the electronics components 16, a first polymeric material 88 is molded over the second portion 23 of the first face 14 encapsulating the electronics components 16 and contacting a portion of the light guide 34. According to several aspects, the light guide 34 includes a side surface 90 extending from the contact surface 38, having the first polymeric material 88 contacting a portion of the side surface 90. According to several aspects, the side surface 90 is oriented perpendicular to the contact surface 38. According to further aspects, a second polymeric material 92 is over-molded over the light guide 34 and at least partially over the first polymeric material 88.

Figure 3:
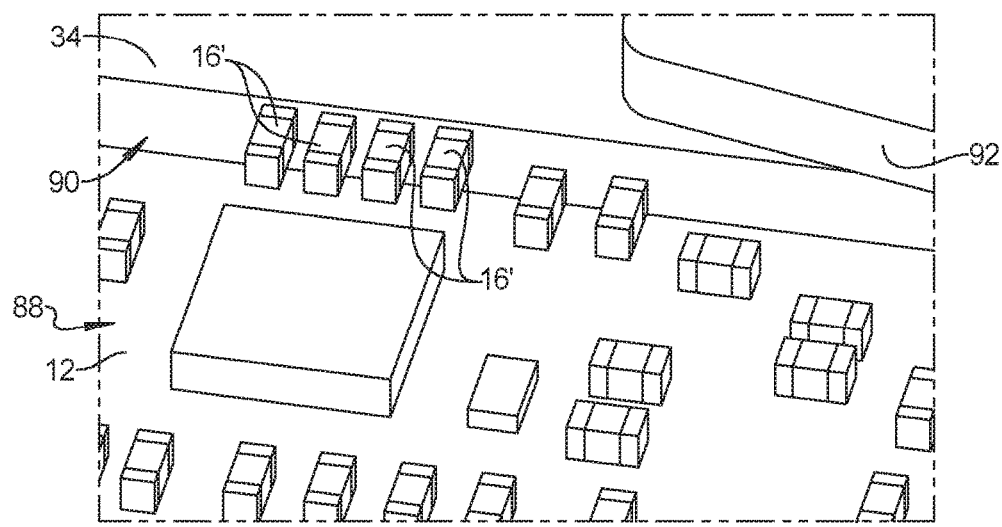
FIG. 3 is a rear perspective view of area 3 of FIG. 2.
Figure 4:
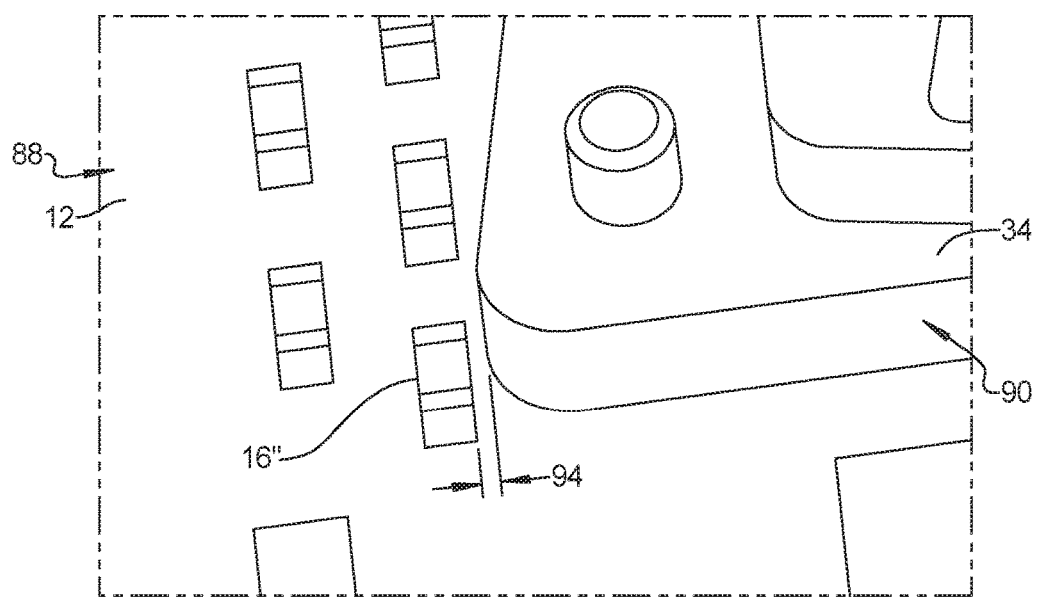
FIG. 4 is an end perspective view of area 4 of FIG. 2.

Referring to FIG. 4 and again to FIGS. 1 through 3, to the maximum extent possible, a minimum clearance 94 is maintained between the side surface 90 of the light guide 34 in its installed position on the body 12 and any of the electronics components 16 such as an exemplary electronic component 16". According to several aspects, the minimum clearance 94 is approximately 0.2 mm which provides for tolerance stack-up and thermal expansion between components.

Figure 5:
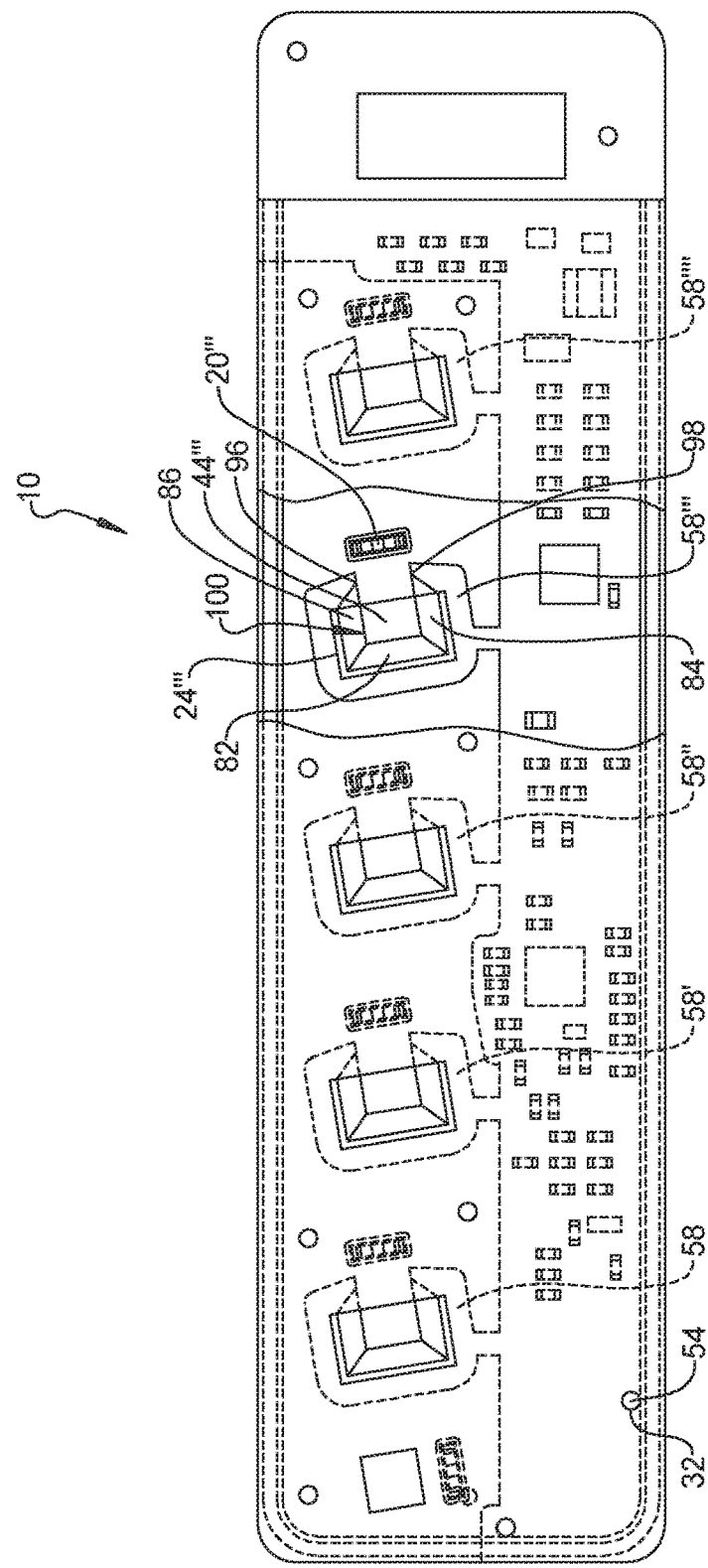
FIG. 5 is a bottom plan view of the molded component of FIG. 1.

Referring to FIG. 5 and again to FIGS. 1 through 4, each of the multiple filler members 58, 58', 58", 58'", 58"" are shown in the installed positions. A partial thickness of the body 12 has been removed for clarity, presenting the filler member 58'", and the light lens 44'" more clearly. The following discussion of the filler member 58'" and the light lens 44'" therefore applies equally to all of the filler members and light lenses. The filler member 58'" substantially surrounds the through aperture 24'" except between opposed end faces 96, 98 where light from the light emitting diode 20'" enters the light lens 44'". A distal end 100 of the light lens 44'" defines a substantially flat face having a geometry that substantially matches a geometry of the through aperture 24'", and thereby covers the through aperture 24'" to create a light outlet. According to several aspects, the distal end 100 is positioned flush with the second face 15 of the body 12. According to further aspects, the distal end 100 is positioned at least partially within the through aperture 24'" but is spaced apart from the second face 15 of the body 12. Light generated by the light emitting diode 20'" enters the light lens 44'", reflects off each of the beveled surfaces 82, 84, 86, and is dispersed from the distal end 100 defining the light outlet from the through aperture 24'" in a direction toward the viewer as shown in FIG. 5.

Referring generally to FIGS. 6 through 8 and again to FIG. 1, each of the light emitting diode receiving pockets 36, 36', 36", 36'", 36"" have a shape corresponding to a shape of the light emitting diodes 20, 20', 20", 20'", 20"", 22. According to several aspects, each of the pockets 36, 36', 36", 36'", 36"" is substantially identical, therefore the following discussion of the first pocket 36 applies equally to the remaining pockets. With specific reference to FIG. 6, the first pocket 36 includes an open end 102 opening at the contact surface 38 defining the body facing side of the light guide 34. A closed end wall 104 of the first pocket 36 is embedded within a body 106 of the light guide 34. The first pocket 36 has a pocket depth 108 which is greater than a height of the light emitting diode 20 standing away from the face 14 of the body 12, and a width 110 of the first pocket 36 is greater than a width of the light emitting diode 20, such that the light emitting diode 20 can be freely received within the first pocket 36 without directly contacting an inside wall 112 of the first pocket 36. According to several aspects, the inside wall 112 defines an incident surface, with the incident surface having a texture or a pebbling to control transmission of the visible light to the light guide 34, for example by more widely dispersing incident light encountering the incident surface.

Figure 6:
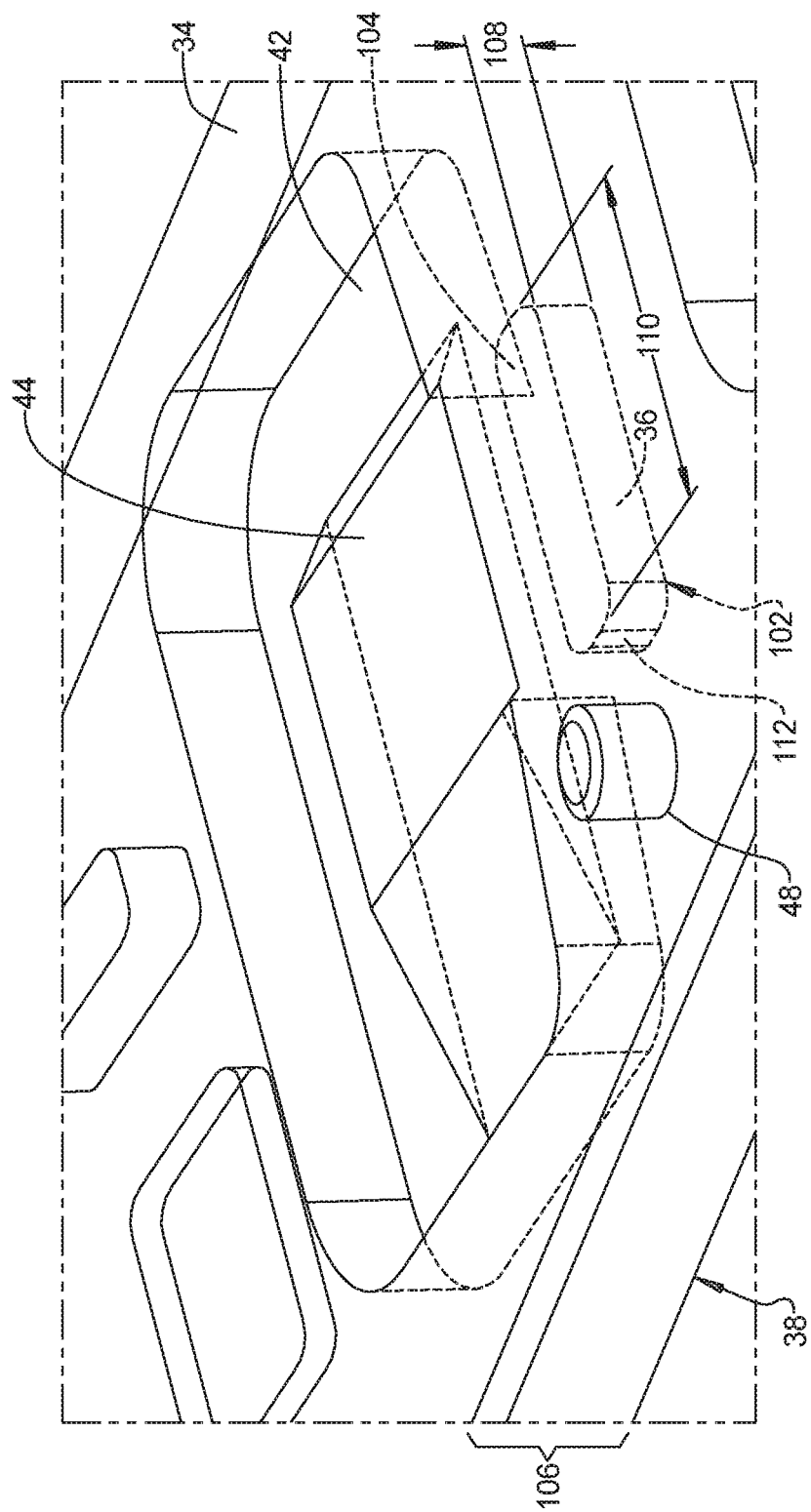
FIG. 6 is a front perspective view of area 6 of FIG. 1.

With continuing reference to FIGS. 1, 2 and 6, when the light guide 34 is placed in direct contact with the body 12 and the light emitting diode 20 is positioned within the first pocket 36, the closed end wall 104 and the inside wall 112, together with the face 14 of the body 12 substantially seal the light emitting diode 20 in the first pocket 36 away from atmospheric conditions surrounding the body 12. The first pocket 36 is positioned to disperse light emitted from the light emitting diode 20 directly and horizontally into the light lens 44, from which light rays are dispersed into the light outlet 42.

Referring specifically to FIG. 7 and again to FIGS. 1 and 6, the first pocket 36 is spaced at a predefined distance 114 from an opening 116 of the light outlet 42 to maximize light generated by the light emitting diode 20 entering the light lens 44. According to several aspects, the predefined distance 114 can range from approximately 1.0 mm to 4.0 mm inclusive. A width 118 of the light emitting diode 20 is less than a width 120 of the planar reflector surface 45 of the light lens 44 at the opening 116 so that substantially all of the light emitted from the light emitting diode 20 in a direction 122 will enter the light lens 44. In addition to the predefined distance 114, the first pocket 36 is spaced at a predefined distance 124 from the through aperture 24.

Referring to FIG. 8 and again to FIGS. 1, 2, 6 and 7, light rays as visible light emitted from the light emitting diode 20 reflect off the multiple beveled surfaces 82, 84, 86 of the light lens 44 into the light outlet 42. The light rays are back-reflected by the filler member 58 positioned within the light outlet 42 and the reflector plate 56 to be emitted in a downward direction as viewed in FIG. 8 out of the through aperture 24 of the body 12.

Referring to FIG. 9 and again to FIG. 1, to complete assembly of the molded component assembly 10, a polymeric substantially opaque film 126 is applied for example by adhesive bonding to the second face 15 of the printed circuit board or body 12. According to several aspects, the opaque film 126 contains a black ink, rendering the opaque film 126 black in color. Light generated by any of the light emitting diodes 20, 20', 20", 20'", 20"" of the body 12 is blocked from passing through the opaque film 126 except at individual locations of multiple indicia 128. The indicia 128 are light transparent portions of the opaque film 126 which may be rendered as successive number pairs and are each individually aligned with one of the through apertures 24, 24', 24", 24'", 24"" where maximum light enhancement is achieved by the light lenses 44, 44', 44", 44'", 44'". A separate window region 130 can be provided through the opaque film 126 for light generated by the light emitting diode 22. According to several aspects, the opaque film 126 can be an acrylonitrile butadiene styrene (ABS) plastic.

A molded component defining a molded component assembly 10 of the present disclosure offers several advantages. These include provision of cavities created in a light guide which receive and substantially surround light emitting diodes positioned on a printed circuit board to protect the light emitting diodes. A first layer of polymeric material is overmolded onto other electronics components on the printed circuit board to protect the components, and a second polymeric material is then overmolded over the first layer and at least partially over the light guide.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A molded component assembly, comprising:
   a printed circuit board with a first face and an oppositely facing second face;
   a light emitting diode mounted on a first portion of the first face;
   multiple electronics components mounted on a second portion of the first face;
   a light guide of a light translucent polymeric material having a contact surface, a light outlet, and a light emitting diode receiving pocket defining a recess in the contact surface sized to receive the light emitting diode when the contact surface directly contacts the first portion of the first face, with visible light from the light emitting diode transmitted through the light guide to the light outlet; and
   a first polymeric material molded over a portion of the second portion of the first face encapsulating the electronics components and contacting a portion of the light guide.

2. The molded component assembly of claim 1, wherein:
   the printed circuit board includes a through aperture extending from the first face to the second face; and
   the light guide includes a light lens extending into the through aperture to create a light outlet from the light lens.

3. The molded component assembly of claim 2, wherein a distal end of the light lens defines a substantially flat face having a geometry that substantially matches a geometry of the through aperture, with the distal end positioned substantially flush with the second face of the printed circuit board.

4. The molded component assembly of claim 2, wherein a distal end of the light lens defines a substantially flat face having a geometry that substantially matches a geometry of the through aperture, with the distal end spaced apart from the second face of the printed circuit board.

5. The molded component assembly of claim 2, further including an opaque layer positioned over the second face of the printed circuit board having a translucent opening positioned over the light outlet.

6. The molded component assembly of claim 2, wherein the light lens includes multiple beveled surfaces that are non-orthogonal with the contact surface to reflect the visible light to the light outlet.

7. The molded component assembly of claim 1, wherein the pocket has a shape corresponding to a shape of the light emitting diode.

8. The molded component assembly of claim 1, wherein the pocket includes an incident surface, the incident surface having a texture to control transmission of the visible light to the light guide.

9. The molded component assembly of claim 1, further including a second polymeric material over-molded over the light guide and over the first material.

10. The molded component assembly of claim 1, wherein the light emitting diode defines a side firing diode, with visible light emitted from the light emitting diode directed generally parallel to the first face of the printed circuit board.

11. The molded component assembly of claim 1, wherein the light guide includes a side surface extending from the contact surface, having the first polymeric material contacting a portion of the side surface.

12. The molded component assembly of claim 11, wherein the side surface is perpendicular to the contact surface.

13. A molded component assembly, comprising:
   a printed circuit board with a first face and an oppositely facing second face, having multiple through apertures extending from the first face to the second face;
   multiple light emitting diodes mounted on a first portion of the first face;
   multiple electronics components mounted on a second portion of the first face;
   a light guide of a light translucent polymeric material having a contact surface; and multiple light emitting diode receiving pockets defining recesses in the contact surface, each sized to receive one of the light emitting diodes when the contact surface directly contacts the first portion of the first face, with visible light from the light emitting diodes transmitted through the light guide;
   a first polymeric material molded over a portion of the second portion of the first face encapsulating the electronics components and contacting a portion of the light guide; and
   each of pockets is spaced at a predefined distance from one of the through apertures to maximize light generated by the light emitting diodes entering the light guide.

14. The molded component assembly of claim 13, wherein the light guide includes multiple light lenses each extending over one of the through apertures to create a light outlet from each of the light lenses.

15. The molded component assembly of claim 14, wherein a width of each of the light emitting diodes is less than a width of a planar reflector surface of each of the light lenses so that substantially all of the light emitted from each of the light emitting diodes enters one of the light lenses.

16. The molded component assembly of claim 14, wherein each of the multiple light lenses is homogeneously connected to the light guide and each extends at least partially into one of the through apertures.

17. The molded component assembly of claim 13, wherein each of the pockets includes an open end opening at the contact surface, and a closed end wall embedded within a body of the light guide.

18. A molded component assembly, comprising:
   a printed circuit board with a first face and an oppositely facing second face, having multiple through apertures extending from the first face to the second face;
   multiple side firing light emitting diodes mounted on a first portion of the first face each directing visible light substantially parallel to the first face;
   multiple electronics components mounted on a second portion of the first face;
   a light guide of a light translucent polymeric material having a contact surface; multiple light lenses each extending at least partially into one of the through apertures to create a light outlet from each of the light lenses; and multiple light emitting diode receiving pockets defining recesses in the contact surface, each sized to receive one of the light emitting diodes when the contact surface directly contacts the first portion of the first face, with visible light from the light emitting diodes transmitted through the light guide;
   a first polymeric material molded over a portion of the second portion of the first face encapsulating the electronics components and contacting a portion of the light guide, and a second polymeric material overmolded onto the first polymeric material and onto the light guide; and
   each of pockets is spaced at a predefined distance from one of the through apertures to maximize light generated by the light emitting diodes entering the light guide and each has a shape corresponding to a shape of the light emitting diodes.

19. The molded component assembly of claim 18, wherein the multiple light lenses each include multiple beveled surfaces to reflect the visible light to the light outlets.

20. The molded component assembly of claim 18, further including a substantially opaque layer of a polymeric material positioned over the second face of the printed circuit board having translucent openings positioned over each of the through apertures, the translucent openings defining successive number pairs.

* * * * *